United States Patent [19]
Jiang et al.

[11] Patent Number: 5,742,188
[45] Date of Patent: Apr. 21, 1998

[54] UNIVERSAL INPUT DATA SAMPLING CIRCUIT AND METHOD THEREOF

[75] Inventors: Leon Li-Feng Jiang, Gaithersburg; Kai Liu; Dae Sun Kang, both of Germantown, all of Md.

[73] Assignee: Samsung Electronics., Ltd., Suwon, Rep. of Korea

[21] Appl. No.: 763,123

[22] Filed: Dec. 10, 1996

[51] Int. Cl.⁶ .................... H03K 19/92; H03K 17/16
[52] U.S. Cl. .................. 327/99; 327/24; 327/29; 327/30; 327/298; 326/41
[58] Field of Search .................. 327/24, 28–30, 327/99, 298; 326/41

[56] References Cited

U.S. PATENT DOCUMENTS

| | | | |
|---|---|---|---|
| 4,355,283 | 10/1982 | Ott | 327/298 |
| 5,083,049 | 1/1992 | Kaby | 327/298 |
| 5,087,828 | 2/1992 | Sato et al. | 327/24 |
| 5,604,452 | 2/1997 | Huang | 327/99 |
| 5,614,845 | 3/1997 | Masleid | 327/298 |
| 5,623,223 | 4/1997 | Pasqualini | 327/99 |
| 5,652,536 | 7/1997 | Nookala et al. | 327/99 |

*Primary Examiner*—Joseph E. Clawson, Jr.
*Attorney, Agent, or Firm*—Jones & Volentine, L.L.P.

[57] ABSTRACT

A circuit for detecting timing errors and for selecting the correct clock edge for mid-point data sampling, includes a rising edge sampling device for sampling an input data signal at a rising edge of an input clock and generating a first interim data signal. A falling edge sampling device samples the input data signal at a falling edge of the input clock and generates a second interim data signal. An error signal generation devise, arranged in each of the rising edge and falling edge sampling devices, generates an error signal if designated setup time and hold time requirements are not met. The error signal is one of an error-rise or error-fall signal. A state machine receives the first and second interim signals and the error signal. The state machine automatically outputs the first interim data signal to a logic device if the error-fall signal is detected, and outputs the second interim data signal to the logic device if the error-rise signal is detected.

11 Claims, 4 Drawing Sheets

UNIVERSAL INPUT DATA SAMPLING CIRCUIT AND METHOD THEREOF

BACKGROUND OF THE INVENTION

1. Field of the Invention

The present invention generally relates to a universal input data sampling circuit, and more particularly, to a data sampling circuit that will monitor the data signal setup and hold time, and automatically select the correct clock edge for mid-point sampling to ensure data signal integrity.

2. Description of the Related Art

In digital electronics design, data signals are sampled by a clock signal after entering a logic device. The data signals are required to be stable during a period before and after the transition edge of the clock. This stable period is known as the setup time and the hold time, respectively.

The design engineer must ensure that the setup and hold time requirements are met in order to maintain data signal integrity. However, the setup/hold requirements vary from device to device, and the requirements also depend on the layout of the printed circuit board (PCB) on which the device resides.

Currently, the input data sample timing condition is checked manually by the design engineer for each different device. The process is not only time consuming, it is also subject to human error.

In light of the foregoing, there exists a need for a universal circuit for monitoring input data signal integrity and for automatically selecting the optimal clock edge for sampling purposes.

SUMMARY OF THE INVENTION

The present invention is directed to a universal input data sampling circuit which substantially overcomes one or more of the problems due to the limitations and disadvantages of the related art.

In general, the circuit of the present invention monitors input data signal integrity and automatically selects the optimal clock edge for mid-point sampling. The circuit comprises a small number of flip-flops that can easily be adapted for use in a programmable logic device (PLD), a field programmable gate array (FPGA), or other logic device.

To achieve these and other advantages and in accordance with the purpose of the invention, as embodied and broadly described, the invention provides for a circuit for detecting timing errors and for selecting the correct clock edge for data input sampling, comprising: a rising edge sampling device for sampling an input data signal at a rising edge of an input clock and generating a first interim data signal; a falling edge sampling device for sampling the input data signal at a falling edge of the input clock and generating a second interim data signal; error signal generation means, disposed in each of the rising edge and falling edge sampling devices, for generating an error signal if designated setup time and hold time requirements are not met, said error signal being one of an error-rise or error-fall signal; and a state machine for receiving the first and second interim signals and the error signal, the state machine having selection means for automatically outputting the first interim data signal to a logic device if the error-fall signal is detected, and outputting the second interim data signal to the logic device if the error-rise signal is detected.

In another aspect, the invention provides for a method for detecting timing errors and for selecting the correct clock edge for data input sampling, the method comprising the steps of: sampling an input data signal at a rising edge of an input clock and generating a first interim data signal; sampling the input data signal at a falling edge of the input clock and generating a second interim data signal; generating an error signal if designated setup time and hold time requirements are not met, said error signal being one of an error-rise or error-fall signal; and receiving the first and second interim signals and the error signal, and automatically outputting the first interim data signal to a logic device if the error-fall signal is detected, and outputting the second interim data signal to the logic device if the error-rise signal is detected.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is directed to a compact circuit which will monitor the data signal setup and hold time, and automatically select the correct clock edge for mid-point sampling. This feature allows one to sample data signals with arbitrary clock-to-output characteristics or monitor signals through wires of any length.

Figure 1:
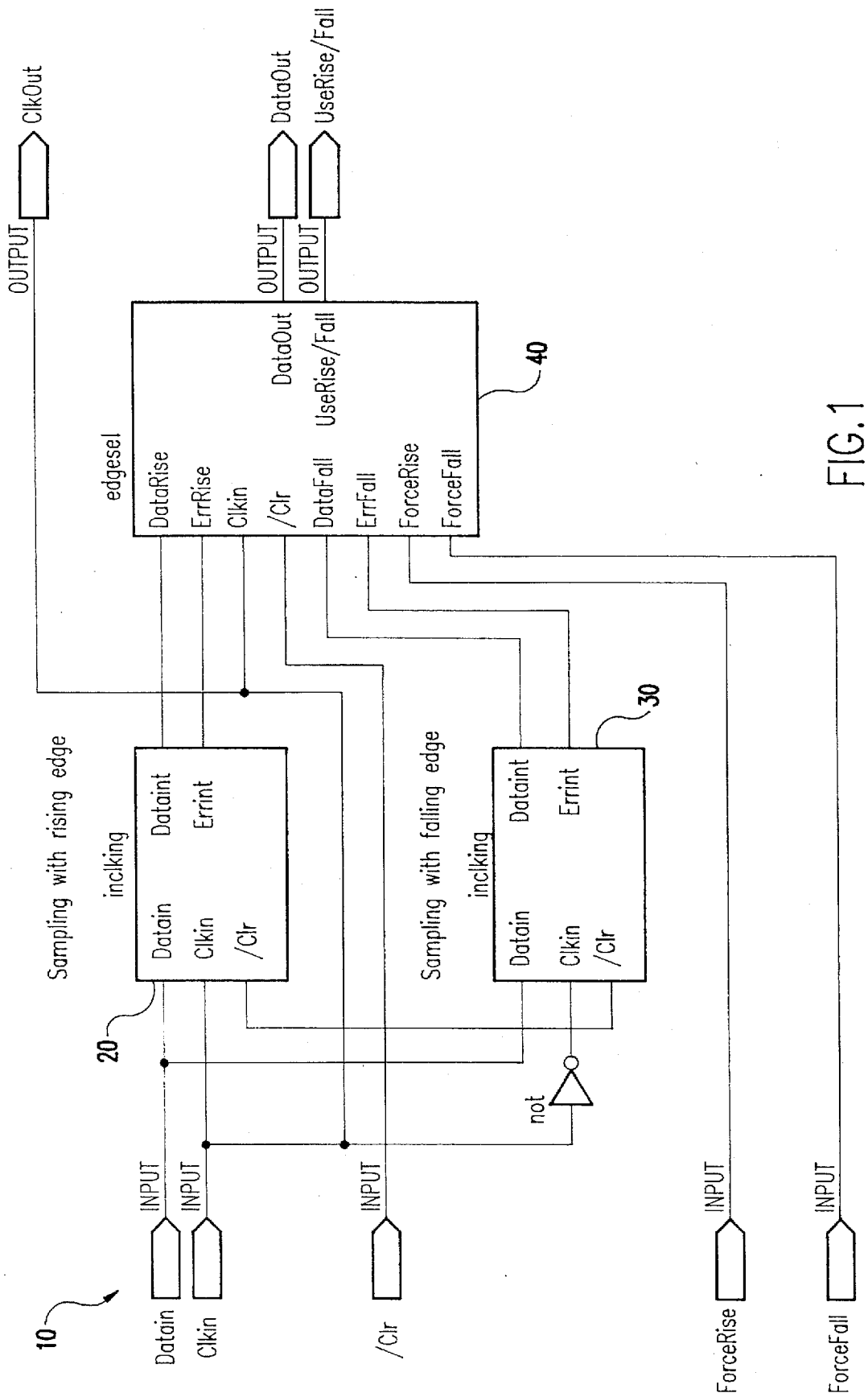
FIG. 1 is a block diagram of the circuit of the present invention.

Reference will first be made to FIG. 1, which illustrates a block diagram of the data sampling circuit 10 of the present invention. The main components of circuit 10 include rising edge sampling device 20, falling edge sampling device 30, and clock edge selection state machine 40.

In operation, the input data signal, DataIn, is first sampled by both the rising edge and falling edge of the input clock, ClkIn, in the respective rising edge sampling device 20 and falling edge sampling device 30. An error signal, ErrInt, is generated if the particular setup and hold requirements are not met.

The sampled data from sampling devices 20 and 30 and the error signals, if any, are sent to the clock edge selection state machine 40. In state machine 40 the error signal, if any, is screened out from the sampled data. This output data signal, DataOut, is then sent to another logic block (not shown) inside a programmable logic device (PLD), a field programmable gate array (FPGA), or other logic device.

Figure 2:
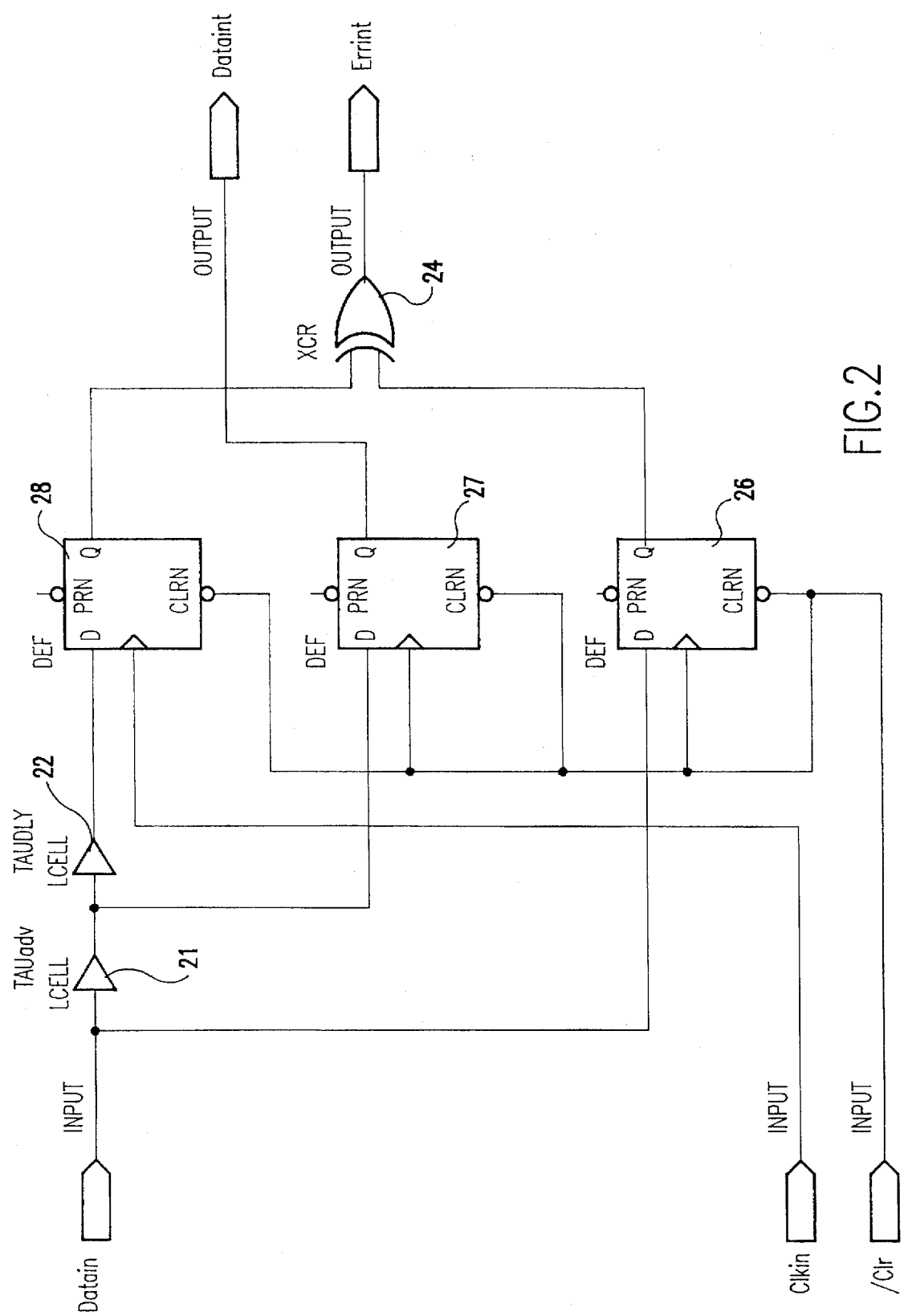
FIG. 2 is block diagram of the input data sampling and error generation circuitry of the present invention.

FIG. 2 is a detailed view of the input data sampling circuitry and error generation circuitry incorporated in each of the rising edge and falling edge sampling devices 20 and 30.

As shown in FIG. 2, the input data signal, DataIn, which can be of any frequency, is delayed twice by delay elements TAUadv (21) and TAUdly (22). The amount of delay for each delay element 21 and 22 should be chosen so as to be larger than the sum of the setup and hold time required by the particular device. That is, TAUadv>=setup time+hold time required, and TAUdly>=setup time+hold time required. Thus, the input data signal is delayed by at least two times the required setup and hold time of the particular device. The TAUadv (21) and TAUdly (22) are chosen so as to detect the error signals reliably.

The input data, which is delayed once by delay element 21, is sampled by the input clock, ClkIn, in flip-flop 27 and sent to the state machine 40 as an interim data output, DataInt (see FIG. 1). A first interim data signal is generated from the rising edge sampling device 20 and a second interim data signal is generated from the falling edge sampling device 30.

The input data, and the input data that is twice delayed by delay elements 21 and 22, are sampled by the input clock, Clkin, in D flip-flops 26 and 28, respectively, and then sent to exclusive-or (XOR) gate 24. It is well known that a flip-flop circuit can maintain a certain binary state until directed by a clock signal to switch that state. The output of XOR gate 24 is the output error signal, Errint, which is then sent to the clock edge selection state machine 40.

Figure 3:
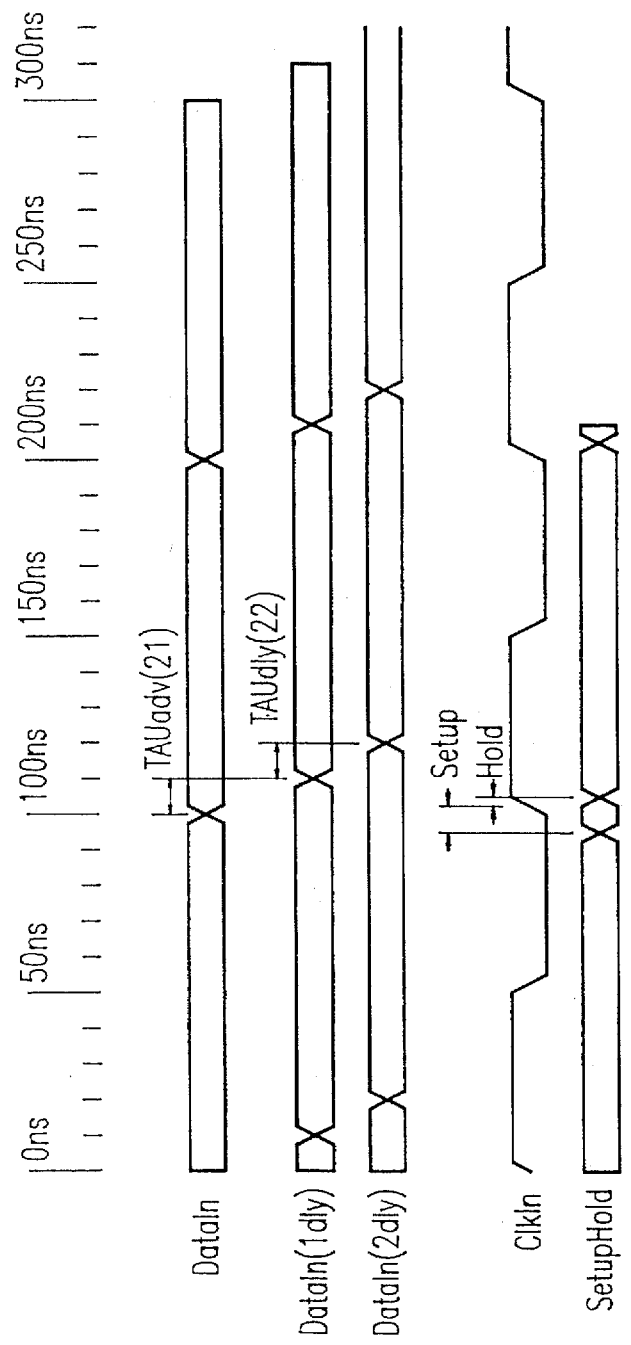
FIG. 3 is a timing diagram illustrating a relationship between the input data and the input clock.

FIG. 3 is a timing diagram illustrating the timing relationship between the input data, DataIn, and the input clock, ClkIn. While either the rising edge or the falling edge may be used for sampling, in the subsequent description the clock rising edge will be used. The following four scenarios illustrate how the circuitry of the present invention react when the DataIn and ClkIn signals have different timing relationships. For each scenario, T[signal edge] denotes the time when the particular signal transition edge occurs. For example, in the following scenarios, T[clock edge] refers to the time the particular clock rising edge occurs. Also, "1dly" refers to input data that is delayed once and "2dly" refers to input data that is delayed twice. The amount of delay for the first delay element "1dly" is TAUadv, and that for the two elements "2dly" is (TAUadv+TAUdly) as shown in the previous section respectively. DataIn (1dly) is used for data output, whereas DataIn and DataIn (2dly) are used for error monitoring.

In the first scenario, if T[DataIn (1dly) edge]—hold time<T[clock edge]<T[DataIn (1dly) edge]+setup time, a timing violation occurs and an error signal is asserted (logic high).

Second, if T[clock edge]<T[DataIn edge]—hold time, there is no timing violation and the error signal is deasserted (logic low).

Third, if T[clock edge]>T[DataIn (2dly) edge]+setup time, there is no timing violation and the error signal is deasserted (logic low).

Fourth, if the clock edge is close to where the DataIn or DataIn (2dly) edge is, timing is marginal and an error signal is asserted (logic high).

When a clock edge triggers the D flip-flop within the time region from T[DataIn] to T[DataIn (2dly)], the so-called "protected region", a timing violation occurs. When this timing violation occurs, that is, the first and fourth scenarios, the error signal, Errint, will be asserted.

The operation of the clock edge selection state machine 40 will now be described. Generally, when an error signal, ErrRise or ErrFall, is asserted from one of the rising edge or falling edge sampling devices 20 or 30 at one clock edge (see FIG. 1), the state machine automatically sends the sampled input data from the other of the sampling devices 20 or 30 to the output, DataOut.

The code for the state machine to accomplish this automatic selection process is set forth below in TABLE 1:

TABLE 1

State Machine Code

```
1 -- Name:    EdgSel.tdf
  -- Function: Select data input based on error condition
  CONSTANT YES = B"1"
  CONSTANT NO = B"0"
5 CONSTANT USERISEEDGE = B"1"
  CONSTANT USERFALLEDGE = B"0"
  SUBDESIGN EdgeSel
  (
10  DataRise,ErrRise,
    ClkIn,/Clr
    DataFall,ErrFall,
    ForceRise,ForceFall   :INPUT;
    DataOut,
15  UseRise/Fall          :OUTPUT;
  )
  VARIABLE
    dDataOut,
20  dUseRise/Fall,
    dErrRise, dErrFall    :DFF;
  BEGIN
    -- Input Definition
25  dErrRise = ErrRise
    dErrFall = ErrFall
    -- Output Definition
    DataOut =dDataOut
30  UseRise/Fall = dUseRise/Fall;
    -- Clock and reset scheme
    (dDataOut,dUseRise/Fall).CLK = ClkIn;
    (dDataOut,dUseRise/Fall).Clrn = /Clr;
35  (dErrRise,dErrFall).CLK = ClkIn;
    (dErrRise,dErrFall).Clrn = /Clr;
    -- Select clock edge for input data sampling, default is falling edge.
    if (ForceRise==YES and ForceFall==NO) then
40    dUseRise/Fall = USERISEEDGE; -- Rising Edge selected
      elsif (ForceFall==YES and ForceRise==NO) then
        dUseRise/Fall = USEFALLEDGE; -- Falling Edge selected
      else
        if (dErrRise==YES and dErrFall==NO) then
45        dUseRise/Fall = USEFALLEDGE;
          elsif (dErrFall==YES and dErrRise==NO) then
            dUseRise/Fall = USERISEDEDGE;
          else
            dUseRise/Fall = dUseRise/Fall; -- No change
50        end if;
    end if;
    -- Select the sampled data for output, default is falling edge.
    if (dUseRise/Fall==USERISEEDGE) then
55    dDataOut = DataRise; -- Use data sampled by rising edge
      else
        dDataOut = DataFall; -- Use data sampled by falling edge
      end if;
    END;
```

This automatic action can be overridden by the ForceRise and ForceFall signals (see FIG. 1), if the designer desires to use a particular clock edge for data sampling. The process to make the forced clock edge selection commences at line 39 of the state machine code shown in TABLE 1.

When ForceRise is asserted and ForceFall is deasserted by a user, through for example, a host microprocessor, the rising clock edge will be used for data input sampling. On the other hand, when ForceRise is deasserted and ForceFall is asserted, the falling clock edge will be used for data input sampling. If both ForceRise and ForceFall are asserted, or none of them are asserted, the clock edge selection will be made by the state machine 40 based on the error condition detected in sampling devices 20 and 30. The result of this clock edge selection is indicated at the output UseRise/Fall in TABLE 1.

Figure 4:
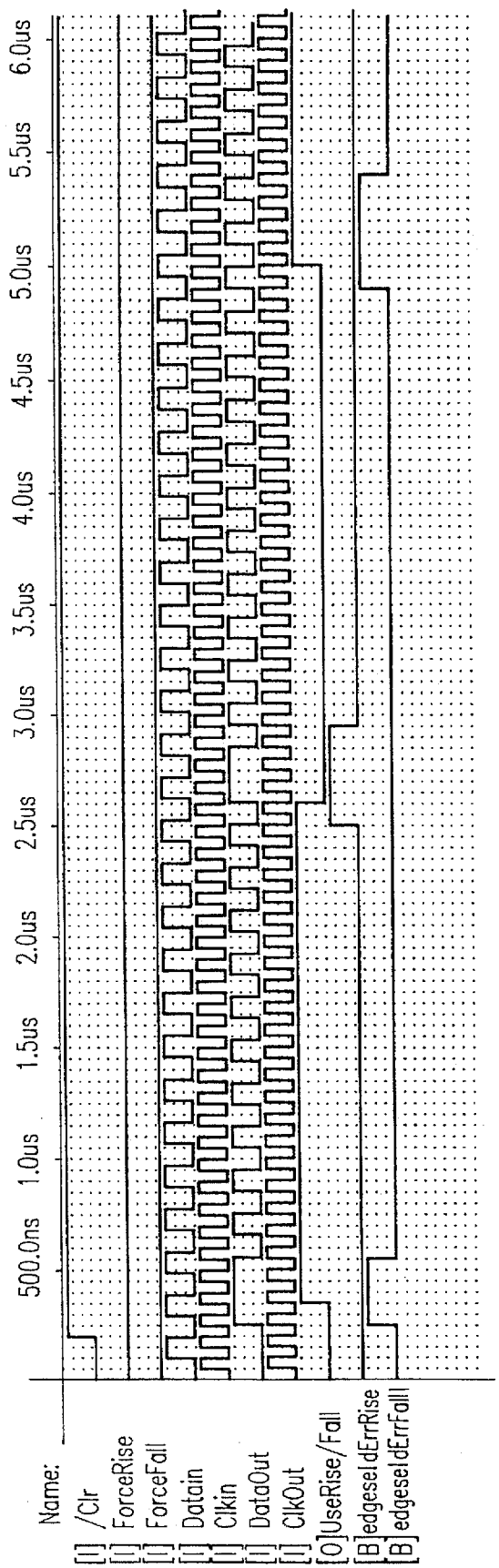
FIG. 4 is a simulated waveform plot showing the signal sequence of the present invention.

FIG. 4 is a waveform plot showing the circuit activity of the present invention. In FIG. 4, ClkIn is set to 10 MHz and the DataIn is set slightly faster. Therefore, as shown in FIG. 4, the clock edge gradually approaches the data signal edge from the front. At approximately 2.5 µS, the clock rising edge enters the protection area. The error flag, dErrRise, is asserted and the state machine automatically switches to use the clock falling edge, indicated by UseRise/Fall=low.

The opposite process occurs at approximately 5.0 µS. That is, the clock falling edge enters the protection area. The error flag, dErrFall, is asserted and the state machine automatically switches to use the clock rising edge, indicated by UseRise/Fall=high.

The present invention illustrates a universal method and circuit which can detect timing errors and select the correct clock edge for mid-point data sampling. The compact circuit will monitor the data signal setup and hold time, and automatically select the correct clock edge for mid-point sampling. This allows one to sample data signals with arbitrary clock-to-output characteristics or monitor signals through wires of any length. The latter feature may be very useful for large equipment, in which the linking wire length may vary from one installation to another. If necessary, the design engineer may also force the circuitry to sample the input data with the desired clock edge. Either edge of the clock may be chosen for the internal logic circuitry of the PLD or FPGA.

While the invention has been described in terms of the embodiments described above, those skilled in the art will recognize that the invention can be practiced with modification within the spirit and scope of the appended claims and their equivalents.

Having thus described my invention, what we claim as new and desire to secure by Letters Patent is as follows:

1. A circuit for detecting timing errors and for selecting the correct clock edge for data input sampling, comprising:
    a rising edge sampling device for sampling an input data signal at a rising edge of an input clock and generating a first interim data signal;
    a falling edge sampling device for sampling the input data signal at a falling edge of the input clock and generating a second interim data signal;
    error signal generation means, disposed in each of said rising edge and falling edge sampling devices, for generating an error signal if designated setup time and hold time requirements are not met, said error signal being one of an error-rise or error-fall signal; and
    a state machine for receiving the first and second interim signals and the error signal, said state machine having selection means for automatically outputting the first interim data signal to a logic device if the error-fall signal is detected, and outputting the second interim data signal to the logic device if the error-rise signal is detected.

2. The circuit of claim 1, said rising edge sampling device comprising:
    first and second delay elements; and
    first, second and third flip-flops,
    wherein the input data signal passes through the first delay element and is sampled by the input clock in the second flip-flop to output the first interim data signal.

3. The circuit of claim 2, said falling edge sampling device comprising:
    third and fourth delay elements; and
    fourth, fifth and six flip-flops,
    wherein the input data signal passes through the third delay element and is sampled by the input clock in the fifth flip-flop to output the second interim data signal.

4. The circuit of claim 3, wherein said error generation means in the rising edge sampling device includes a first exclusive-or gate for outputting an error signal, wherein a first input to the first exclusive-or gate is the input data signal that is sampled by the input clock in the first flip-flop, and a second input to the exclusive-or gate is the input data signal that passes through the first and second delay elements and is sampled by the input clock in the third flip-flop.

5. The circuit of claim 4, wherein said error generation means in the falling edge sampling device includes a second exclusive-or gate for outputting an error signal, wherein a first input to the second exclusive-or gate is the input data signal that is sampled by the input clock in the fourth flip-flop, and a second input to the second exclusive-or gate is the input data signal that passes through the third and fourth delay elements and is sampled by the input clock in the sixth flip-flop.

6. The circuit of claim 5, wherein a delay time for each of the first, second, third and fourth delay elements is greater than the sum of the setup and hold time required by a particular device.

7. The circuit of claim 1, further comprising a plurality of manually selected input signals to said state machine for overriding the automatic output of the first and second interim data signals.

8. The circuit of claim 7, further comprising means in said state machine responsive to said manual selection for outputting one of the rising edge or falling edge of the clock signal for data input sampling.

9. A method for detecting timing errors and for selecting the correct clock edge for data input sampling, the method comprising the steps of:
    sampling an input data signal at a rising edge of an input clock and generating a first interim data signal;
    sampling the input data signal at a falling edge of the input clock and generating a second interim data signal;
    generating an error signal if designated setup time and hold time requirements are not met, said error signal being one of an error-rise or error-fall signal; and
    receiving the first and second interim signals and the error signal, and automatically outputting the first interim data signal to a logic device if the error-fall signal is detected, and outputting the second interim data signal to the logic device if the error-rise signal is detected.

10. The method of claim 9, further comprising the step of:
    overriding the automatic output of the first and second interim data signals.

11. The method of claim 10, further comprising the step of:
    outputting one of the rising edge or falling edge of the clock signal for data input sampling in response to said overriding step.

* * * * *